(12) United States Patent
Horii

(10) Patent No.: US 10,306,795 B2
(45) Date of Patent: May 28, 2019

(54) EQUIPMENT SECURING DEVICE, ATTACHMENT-FRAME-INTERNAL STORAGE EQUIPMENT, RACK-MOUNT SEVER DEVICE AND EQUIPMENT SECURING METHOD

(71) Applicant: NEC Platforms, Ltd., Kawasaki-shi, Kanagawa (JP)

(72) Inventor: Yuji Horii, Kanagawa (JP)

(73) Assignee: NEC PLATFORMS, LTD., Kanagawa (JP)

( * ) Notice: Subject to any disclaimer, the term of this patent is extended or adjusted under 35 U.S.C. 154(b) by 0 days.

(21) Appl. No.: 15/303,572

(22) PCT Filed: Apr. 16, 2015

(86) PCT No.: PCT/JP2015/002095
§ 371 (c)(1),
(2) Date: Oct. 12, 2016

(87) PCT Pub. No.: WO2015/174015
PCT Pub. Date: Nov. 19, 2015

(65) Prior Publication Data
US 2017/0042056 A1 Feb. 9, 2017

(30) Foreign Application Priority Data

May 16, 2014 (JP) ................. 2014-102597

(51) Int. Cl.
*H05K 7/14* (2006.01)
*G11B 33/02* (2006.01)
*G06F 1/16* (2006.01)

(52) U.S. Cl.
CPC ............ *H05K 7/1489* (2013.01); *G06F 1/16* (2013.01); *G11B 33/02* (2013.01); *H05K 7/14* (2013.01)

(58) Field of Classification Search
CPC .......... H05K 7/1489; H05K 7/14; G06F 1/16; G11B 33/02
(Continued)

(56) References Cited

U.S. PATENT DOCUMENTS 6,226,157 B1 5/2001 Kim
6,317,329 B1 11/2001 Dowdy et al.
(Continued)

FOREIGN PATENT DOCUMENTS

JP S49-28947 U 3/1974
JP S50-38230 11/1975
(Continued)

OTHER PUBLICATIONS

Japanese Office Action for JP Application No. 2014-102597 dated Apr. 7, 2015 with English Translation.
(Continued)

*Primary Examiner* — Rockshana D Chowdhury

(57) ABSTRACT

The present invention reduces an area in which an attachment frame for storing equipment on which a device is mounted is arranged.

An equipment securing device is equipped with a panel mounted on the front surface of the equipment, a securing member provided on a first end part of the panel such that the tip end protrudes from the first end part of the panel; a handle, having a shaft at a second end part on the side opposite the first end part, and attached to the panel so as to be capable of rotating around the shaft, between a closed position which is a position along the extension direction of the panel, and an open position which is a position in a direction intersecting the panel; and an operating point member, the orientation of which changes in response to the rotation of the handle, and which is (Continued)

provided on the second end part of the handle such that the tip end protrudes from the second end part.

8 Claims, 11 Drawing Sheets

(58) Field of Classification Search
USPC .................................................. 361/679.33
See application file for complete search history.

(56) References Cited

U.S. PATENT DOCUMENTS

| | | | | |
|---|---|---|---|---|
| 6,325,353 | B1 | 12/2001 | Jiang | |
| 6,460,948 | B2* | 10/2002 | Roesner | G06F 1/184 312/223.1 |
| 7,072,177 | B2* | 7/2006 | Peng | G06F 1/184 248/551 |
| 7,558,058 | B2 | 7/2009 | Hidaka | |
| 8,118,271 | B2* | 2/2012 | Peng | G06F 1/187 248/221.11 |
| 8,238,091 | B2* | 8/2012 | Chang | G11B 33/124 361/679.33 |
| 8,248,775 | B2* | 8/2012 | Zhang | G11B 33/124 248/27.1 |
| 8,300,398 | B2* | 10/2012 | Zhang | G06F 1/187 312/223.2 |
| 8,369,077 | B2* | 2/2013 | Peng | G11B 33/124 248/27.1 |
| 2005/0024819 | A1 | 2/2005 | Peng et al. | |
| 2006/0028805 | A1 | 2/2006 | Hidaka | |
| 2009/0279249 | A1 | 11/2009 | Crippen et al. | |
| 2010/0294905 | A1* | 11/2010 | Peng | G06F 1/187 248/222.12 |

FOREIGN PATENT DOCUMENTS

| | | |
|---|---|---|
| JP | S63-118272 U | 7/1988 |
| JP | 2552371 Y2 | 7/1997 |
| JP | 2001-24364 A | 1/2001 |
| JP | 2001-155475 A | 6/2001 |
| JP | 2003-141869 A | 5/2003 |
| JP | 2006-294201 A | 10/2006 |
| TW | M244715 U | 9/2004 |
| TW | M249173 U | 11/2004 |
| TW | M291066 U | 5/2006 |
| TW | 201103013 A | 1/2011 |

OTHER PUBLICATIONS

International Search Report for PCT Application No. PCT/JP2015/002095, dated Jun. 23, 2015.
English translation of Written opinion for PCT Application No. PCT/JP2015/002095.
Taiwanese Office Action for TW Application No. 104115151 dated Mar. 13, 2017 with English Translation.
Extended European Search Report for EP Application No. EP15793636.0 dated Dec. 12, 2017.

* cited by examiner

Fig. 12
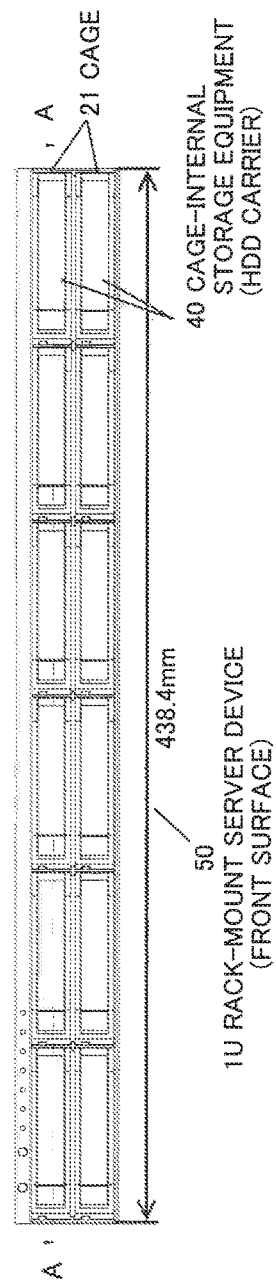
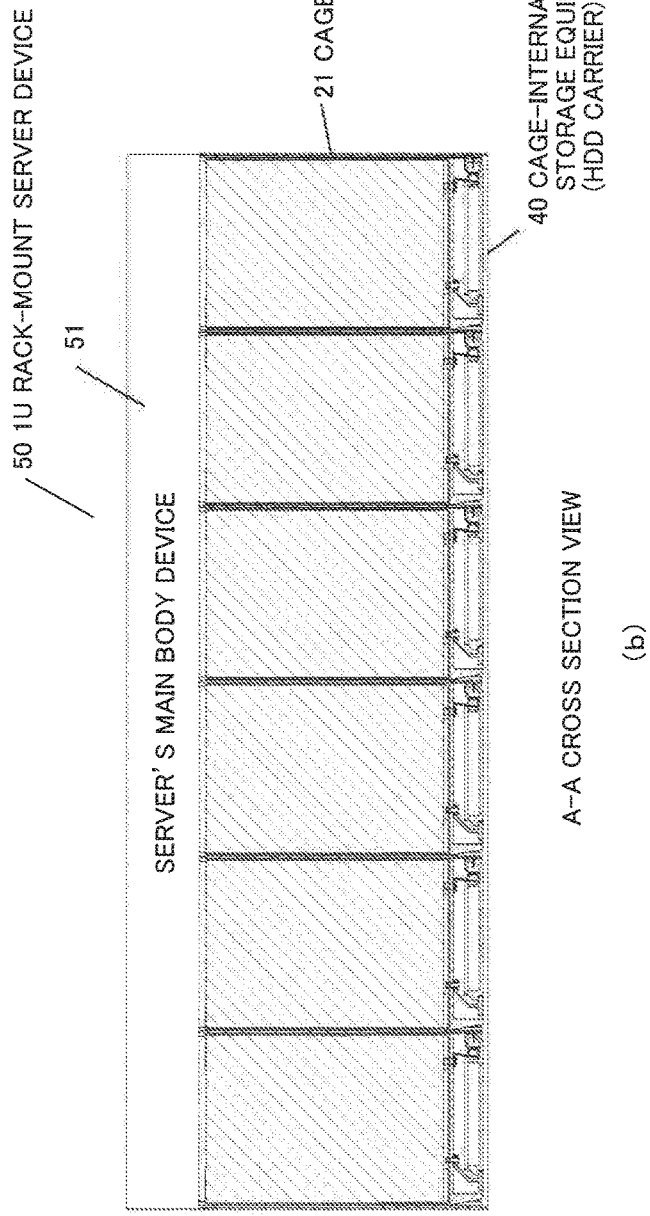

EQUIPMENT SECURING DEVICE, ATTACHMENT-FRAME-INTERNAL STORAGE EQUIPMENT, RACK-MOUNT SEVER DEVICE AND EQUIPMENT SECURING METHOD

This application is a National Stage Entry of PCT/JP2015/002095 filed on Apr. 16, 2015, which claims priority from Japanese Patent Application 2014-102597 filed on May 16, 2014, the contents of all of which are incorporated herein by reference, in their entirety.

TECHNICAL FIELD

The present invention relates to an equipment securing device, an attachment-frame-internal storage equipment, a rack-mount server device and an equipment securing method, and particularly reduces to a device or the like which reduces an arrangement area of an attachment frame which houses a device.

BACKGROUND ART

FIG. 1 illustrates an exterior appearance (a) and a cross sectional view (c) of a case when an existing HDD (Hard Disk Drive) carrier 13 is stored by a cage 11 which is storage equipment for the HDD carrier 13. FIG. 1 also illustrates a cross sectional view (b) of a case when the HDD carrier 13 is on the way to being stored by the cage 11 which is the storage equipment for the HDD carrier 13. A tip end part 14-2 of a handle 14 of the HDD carrier 13 is hooked on a hole 12 of a side surface of the cage, and the HDD carrier 13 is inserted into the cage 11 by the principle of leverage with a portion pushed by a user's hand as a force point, a shaft part 14-1 as a fulcrum and the tip end part 14-2 of the handle 14 inserted into the hole 12 of the side surface of the cage as an operating point.

A plurality of cages 11 each of which stores the HDD carrier 13 as described above and a main body device of a server are mounted on a rack to configure a rack-mount server device.

PTL1 discloses on-vehicle equipment which is stored in an attachment frame. A lock pawl of the on-vehicle equipment protrudes into a lock hole of the attachment frame to fix the on-vehicle equipment to the attachment frame. When a trigger member is operated, the lock pawl is disengaged from the lock hole of the attachment frame and consequently it is possible to pull out the on-vehicle equipment from the attachment frame.

PTL2 discloses an equipment detachment device which stores equipment. The equipment detachment device includes an operation lever. The operation lever moves between a position at which an opening of an equipment storing part is closed, and a position at which the opening is opened. When the operation lever is at the position at which the opening is closed, a pawl of a lock part is hooked on an equipment's main body to fix the equipment at the position.

CITATION LIST

Patent Literature

[PTL 1] Japanese Unexamined Utility Model Application Publication No. 63(1988)-118272
[PTL 2] Japanese Patent Application Laid-Open Publication No. 2001-155475

SUMMARY OF INVENTION

Technical Problem

In the HDD carrier 13 of FIG. 1, when the handle 14 is closed after the tip end part 14-2 of the handle 14 is hooked in the hole 12, the tip end 14-2 protrudes from a side surface of the cage 11 by 2 to 4 mm. Therefore, in the case that a plurality of cages 11 are arranged in parallel, it is necessary to prepare an excessive area. The excessive area becomes an obstacle when implementing a large number of HDD carriers 13 in a limited area.

On the other hand, in the case of shortening the handle 14 so that the tip end part 14-2 of the handle 14 may not protrude, another problem that, when rotating the handle 14, the tip end part 14-2 is not hooked in the hole 12 of the cage 11 is caused. Furthermore, there is a problem that, when the cage 11 receives an impact, the HDD carrier 13 is ejected from the cage 11 since a height of engagement of the tip end part 14-2 is low.

The art disclosed in PTL1 has the same problem as the HDD carrier 13 described above. That is, in the case that the pawl of the lock part is long the pawl protrudes outside when fixing the on-vehicle equipment to the attachment frame. Thus, it is necessary to prepare space around the attachment frame. In the case that the pawl of the lock part is long, there are high possibilities that the on-vehicle equipment is disengaged when the vehicle receives an impact. Furthermore, there is also a problem that mechanism is complicated, and thus its implementation is not easy. The art disclosed in PTL 2 is related to a device storing the equipment, and accordingly, the art is not applicable to solving the above-mentioned problem.

The present invention has been made in order to solve the above-mentioned problem, and a main object of the present invention is to provide a means which reduces an arrangement area of a cage for storing equipment.

Solution to Problem

An equipment securing device according to an aspect of the present invention includes a panel mounted on a front surface of an equipment, a securing member provided on a first end part of the panel, a tip end of the securing member being movable to a position protruding in an extension direction of the panel from the first end part of the panel, the securing member having elasticity, a handle including a shaft at a second end part existing on opposite side of the first end part and attached to the panel, the handle being rotatable around the shaft between a closed position and a opened position, the closed position being a position along the extension direction of the panel and an opened position being a position in a direction intersecting the panel, and an operating point member provided on the second end part side of the handle, the orientation of the operating point member changing in response to the rotation of the handle, and a tip end of the operating point member being movable to a position protruding in a direction intersecting a direction of the shaft from the second end part.

An equipment securing method according to an aspect of the present invention includes mounting a panel on a front surface of equipment inserted backward into an attachment frame having holes close to front parts of both side surfaces from a front side opening part of the attachment frame, providing a securing member close to a first end of the panel, one out of a left end and a right end being denoted as the first end and the other being denoted as a second end, and on the way to insertion, a tip end of the securing member being pressed against a front part of the hole of the first end side side-surface by elastic force, attaching a shaft of a handle close to the second end of the panel, the handle including a shaft close the second end, and the handle rotating around the shaft between a closed position where the handle leans against the panel and an opened position protruding on the front side, providing an operating point member at the second end of the handle, a tip end of the operating point member being pushed against a front part of the hole of the second end side side-surface by elastic force on the way to insertion, and inserting the tip end of the operating point member into the hole of the second end side side-surface by elastic force in a state that the equipment is further inserted, further inserting the equipment by force given at a time of rotation and an operating point being the operating point member when the handle is rotated in a direction toward the opened state, and inserting the tip end of the securing member into the hole of the first end side side-surface by elastic force.

Advantageous Effects of Invention

According to the equipment securing device of the present invention, it is possible to reduce the arrangement area of the cage for storing the equipment on which the device is mounted.

BRIEF DESCRIPTION OF DRAWINGS

FIG. 12 illustrates structure of a 1U rack-mount server device 50 which is equipped with 12 machines of the cage-internal storage equipment 40.

DESCRIPTION OF EMBODIMENTS

First Exemplary Embodiment

Figure 1:
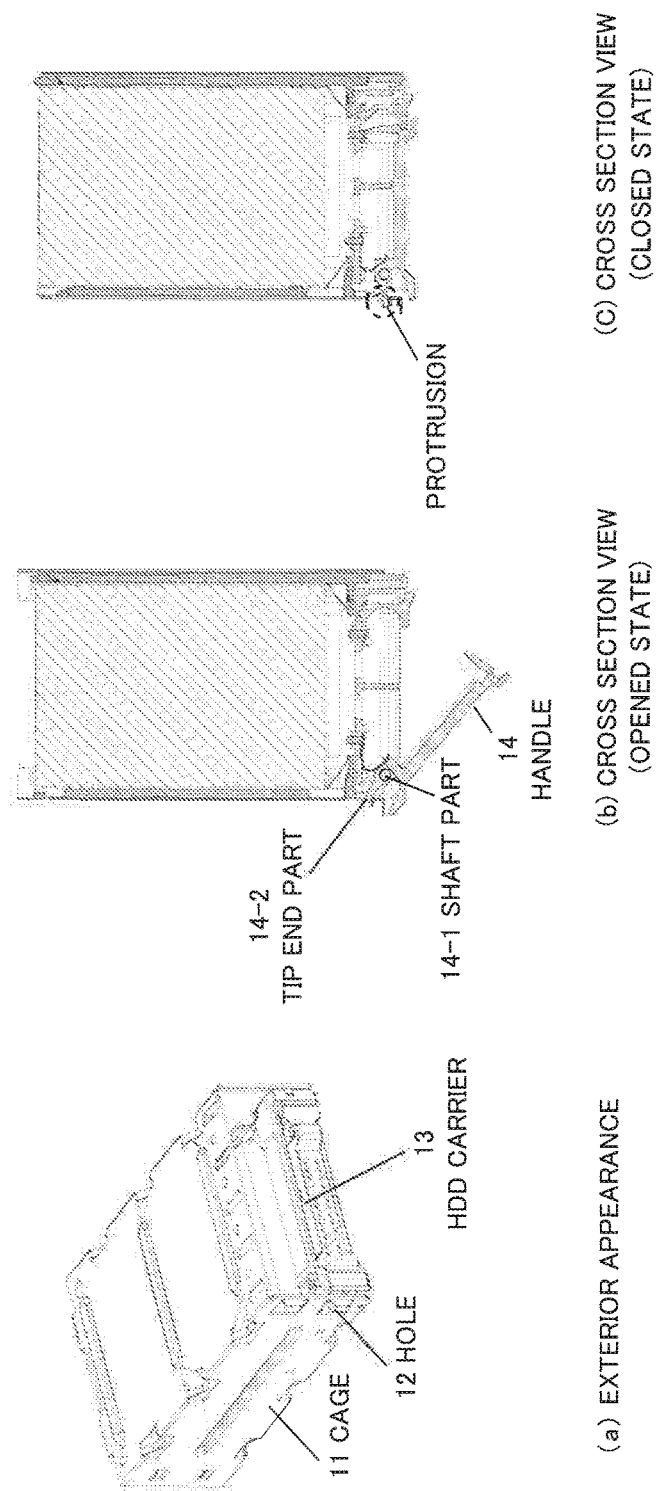
FIG. 1 is a diagram illustrating a state that the existing HDD carrier 13 is stored by the cage 11 which is storage equipment for the existing HDD carrier 13.
Figure 2:
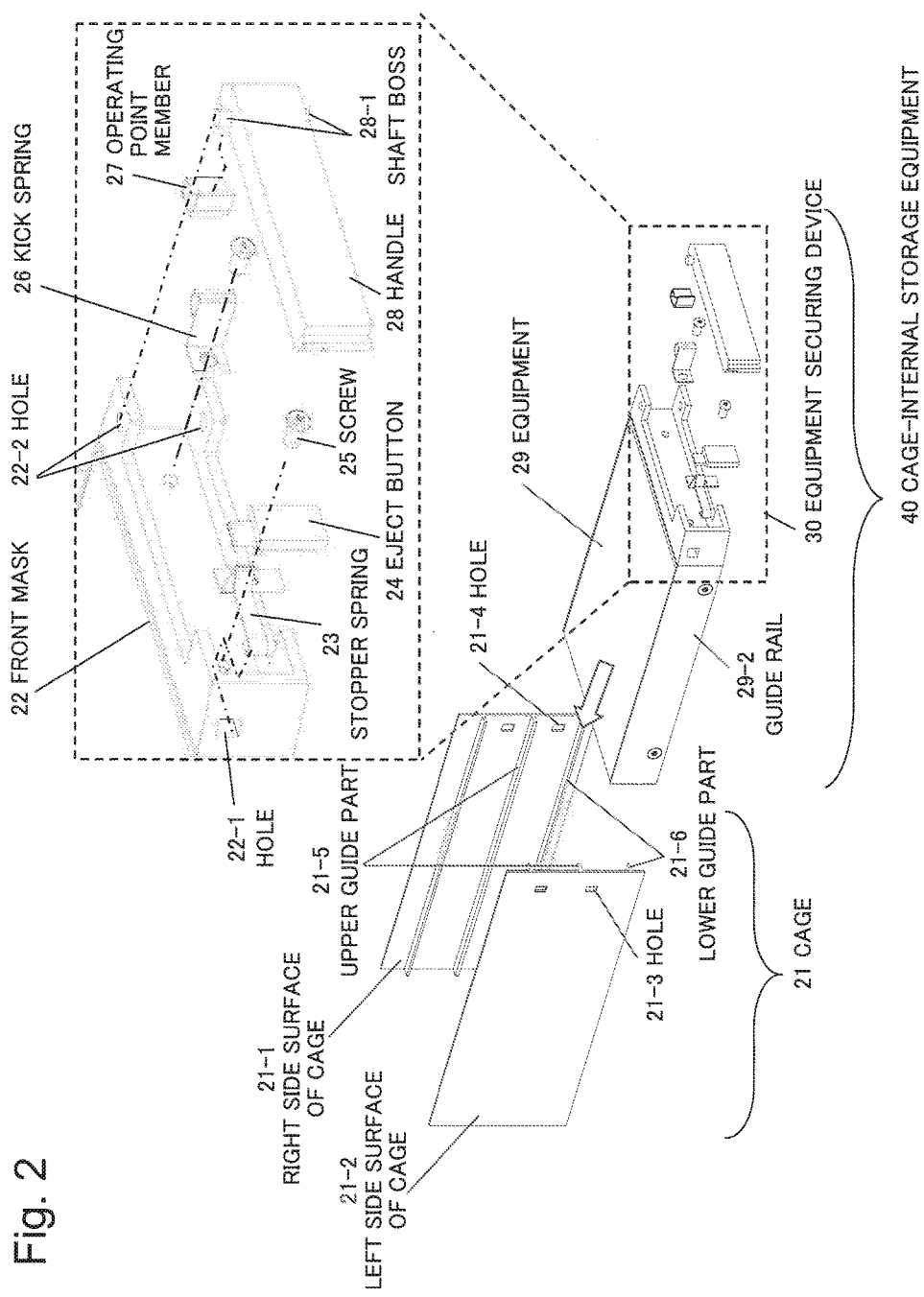
FIG. 2 is a diagram illustrating structure of an equipment securing device 30 according to a first exemplary embodiment.

FIG. 2 is a diagram illustrating structure of the equipment securing device 30 according to the present exemplary embodiment. The equipment securing device 30 is a device for storing an equipment 29 into a cage 21. Here, the equipment 29 is, for example, HDD. Although FIG. 2 does not illustrate a whole of the cage 21, an exterior appearance of the cage 21 is similar to the cage 11 illustrated in FIG. 1.

The equipment securing device 30 is attached to a front surface of the equipment 29, and guide rails 29-2 are attached to side surfaces of the equipment 29 respectively, and then the equipment 29 is stored in the cage 21. Here, the cage-internal storage equipment 40 is equipment including the equipment 29 to which the equipment securing device 30 and the guide rail 29-2 are attached. The cage-internal storage equipment 40 is, for example, an HDD carrier.

The equipment securing device 30 is constituted by attaching the stopper spring 23, an eject button 24, the kick spring 26, the operating point member 27 and the handle 28 to a front mask 22.

Figure 3:
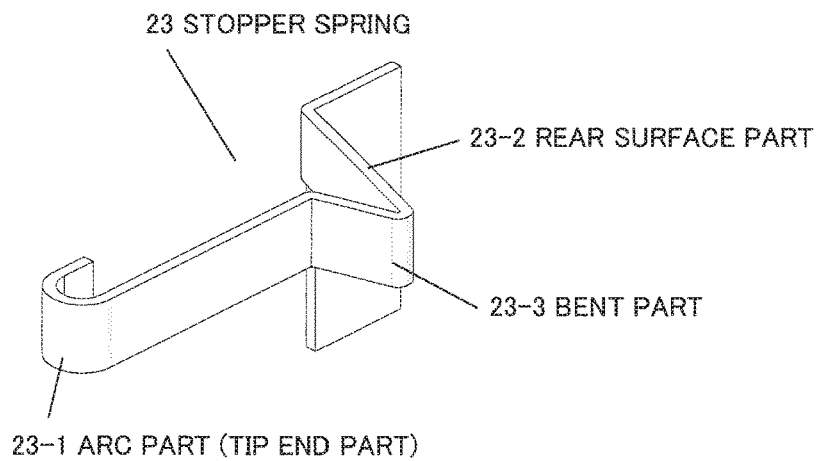
FIG. 3 is a structural diagram of a stopper spring 23.

The stopper spring 23 is fixed by a screw 25 at a position close to a left end (left end part) of the front mask 22, so that a tip end of the stopper spring 23 may protrude in a left direction of the left side guide rail 29-2 through a hole 22-1 provided in a left side surface of the front mask 22 which protrudes on a front side of the front mask 22. FIG. 3 is a structural diagram of the stopper spring 23. The stopper spring 23 includes an arc part 23-1 corresponding to a tip end part, a bent part 23-3 on a leaf spring, and a rear surface part 23-2 corresponding to a rear surface of the bent part 23-3 which are arranged in this order from the left in a state that the stopper spring 23 is fixed to the front mask 22. The stopper spring 23 is expandable in a longitudinal direction due to elastic force of the bent part 23-3. That is, the arc part 23-1, which is the tip end part, is movable in an extending direction of a front surface of the front mask 22 in FIG. 2.

The eject button 24 is fixed at a position close to the left end of the front mask 22 by the screw 25. The eject button 24 is made of resin and has flexibility, and is capable of deforming to some extent in a left direction due to the elasticity.

An upper side surface and a lower side surface protrude to the front side of the front surface are arranged at a position which is close to a right end of the front mask 22 (right end part). Holes 22-2 are provided on each of the upper side surface and the lower side surface. Moreover, shaft bosses 28-1 are provided at positions which are close to a right end of the handle 28. The handle 28 is attached to the front mask 22 by fitting the shaft bosses 28-1 into the two holes 22-2 of the front mask 22 respectively. The handle 28 is rotatable around the hole 22-2 (that is, shaft bosses 28-1 work as an axis of rotation). The handle 28 is freely rotatable from a state (hereinafter referred to as a closed state in some cases), in which the handle 28 is parallel to the front mask 22 by leaning to the front mask 22, up to a state (hereinafter referred to as an opened state in some cases) in which the handle 28 is rotated in a front direction, for example, by 45 degrees.

Figure 5:
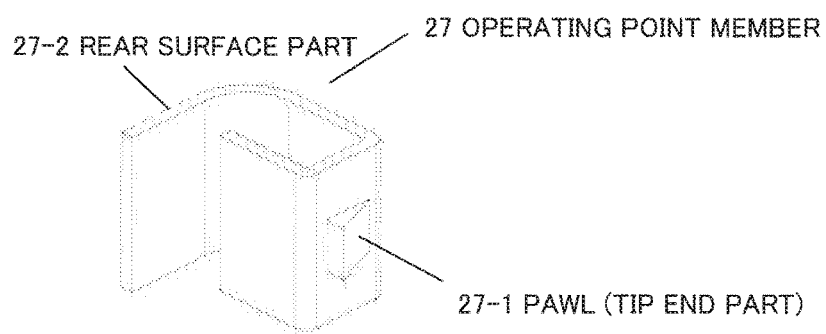
FIG. 5 is a structural diagram of an operating point member 27.

The operating point member 27 is attached to the right end of the handle 28. FIG. 5 is a structural diagram of the operation point member 27. The operating point member 27 includes a pawl 27-1 corresponding to a tip end and a rear surface part 27-2, which are arranged in this order from the right in a state that the operating point member 27 is fixed to the handle 28.

Figure 4:
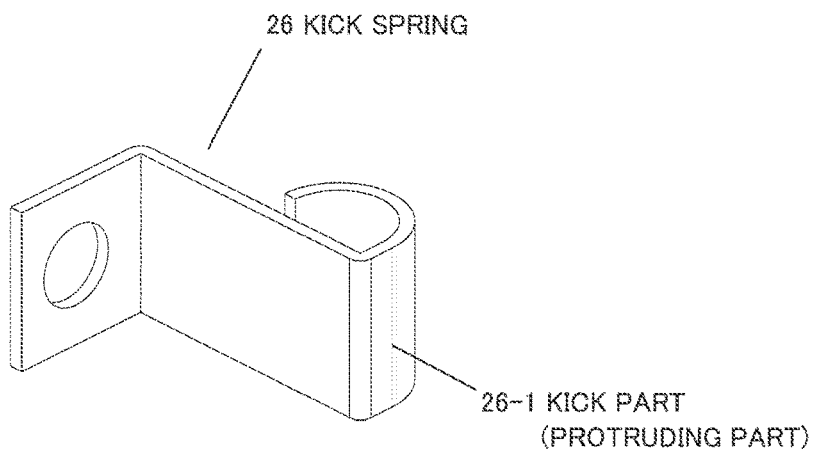
FIG. 4 is a structural diagram of a kick spring 26.

The kick spring 26 is fixed to the front mask 22 by the screw 25. FIG. 4 is a structural diagram of the kick spring 26. The kick spring 26 includes a kick part 26-1 which protrudes to the side of the handle 28 in a state that the kick spring 26 is attached to the front mask 22. The kick spring 26 is fixed to a position on the front mask 22 where the kick part 26-1 can come into contact with the rear surface part 27-2 of the operating point member 27.

The cage-internal storage equipment 40 is held by an upper guide part 21-5 and a lower guide part 21-6, which are provided on a right side surface of cage 21-1 and a left side surface of cage 21-2 respectively, to be inserted and pull out.

Moreover, a hole 21-4 provided in the right side surface of cage 21-1 and a hole 21-3 is provided in the left side surface of cage 21-2. Each of the hole 21-4 and the hole 21-3 is provided at a position close to a front side opening part of the cage 21 which is used for inserting and pulling out the cage-internal storage equipment 40. The hole 21-4 of the right side surface of cage 21-1 is closer to the front side opening part of the cage 21, which is an insertion opening, than the hole 21-3 of the left side surface of cage 21-2. The hole 21-4 has a shape so that the pawl 27-1, which is the tip end of the operating point member 27, can be inserted, and the hole 21-3 has a shape so that the ark part 23-1, which is the tip end of the stopper spring 23, can be inserted.

Figure 6:
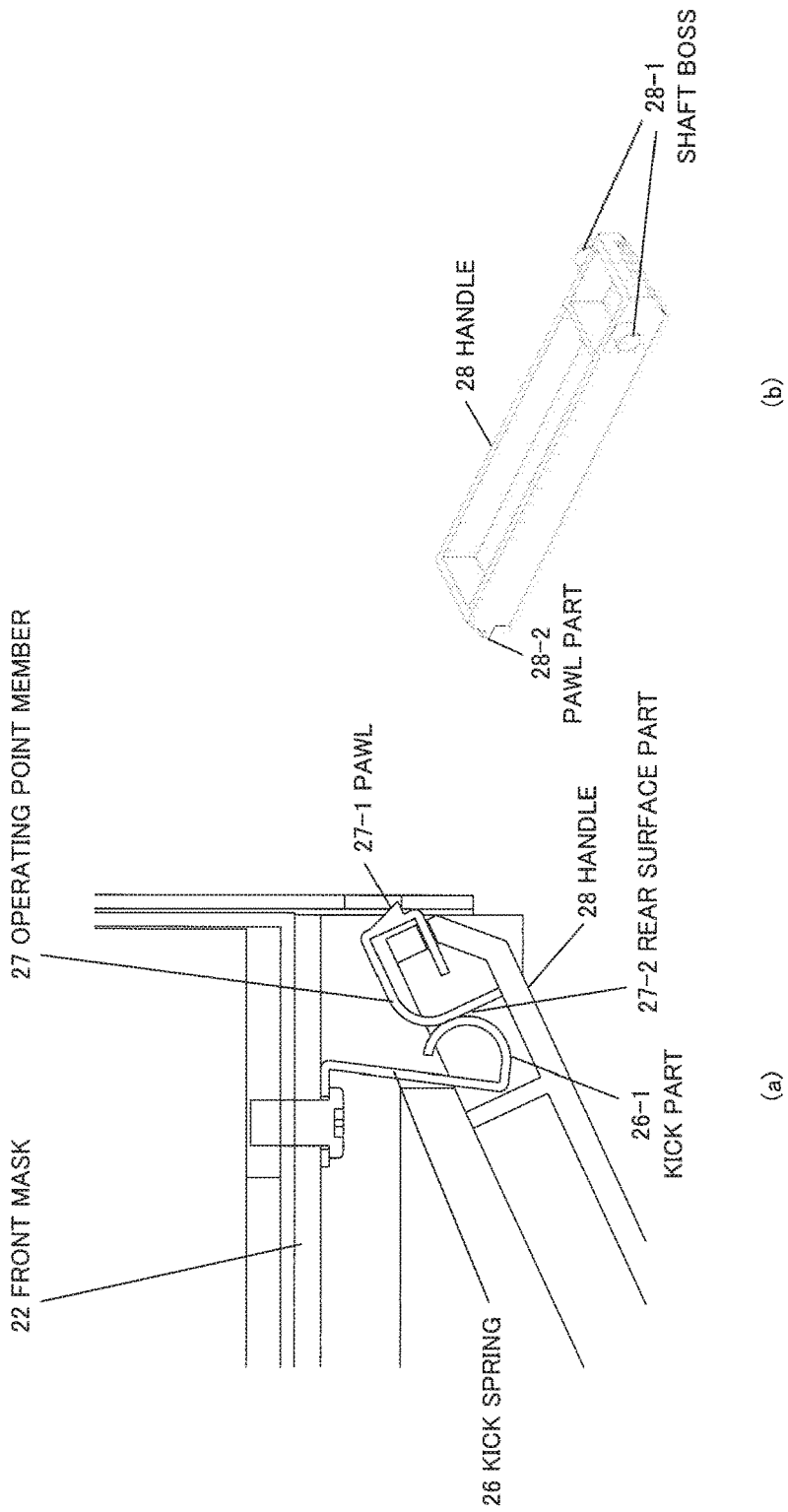
FIG. 6 illustrates a state that the kick spring 26 and the operating point member 27 are stored inside a handle 28.

FIG. 6 (a) illustrates a state that the kick spring 26, which acts as a non-limiting embodiment of a push-out member, and the operating point member 27 arc stored inside the handle 28. Here, FIG. 6 (b) is a perspective view of the handle 28. The pawl 27-1 of the operating point member 27 can freely move in a longitudinal direction of the handle 28 due to elasticity of the rear surface part 27-2. The rear surface part 27-2 of the operating point member 27 is pressed by the kick part 26-1 of the kick spring 26 within the handle 28, and consequently the pawl 27-I of the operating point member 27 is pushed out in an external (right) direction. The kick part 26-1 always pushes out the pawl 27-1 in an external (right) direction of the cage 21. The tip end pawl 27-1 can be hooked in the hole 21-4. A position, at which the pawl 27-1 is hooked in the hole 21-4, has a height equal to or less than a board thickness of the right side surface of cage 21-1, for example, a height of 0.8 mm.

Since each of the kick spring 26, the stopper spring 23 and the operating point member 27 needs to have a certain strength, it is desirable that each of them is made of sheet metal with strength such as stainless steel or the like. It is desirable that each of the front mask 22, the handle 28, the eject button 24 is made of plastic which can be formed in a complicate shape with a low cost. Moreover, the side surface member of the cage is made of sheet metal used for the device. The sheet metal is, for example, mild sheet metal which has a certain strength and a thickness of 0.8 mm.

Figure 7:
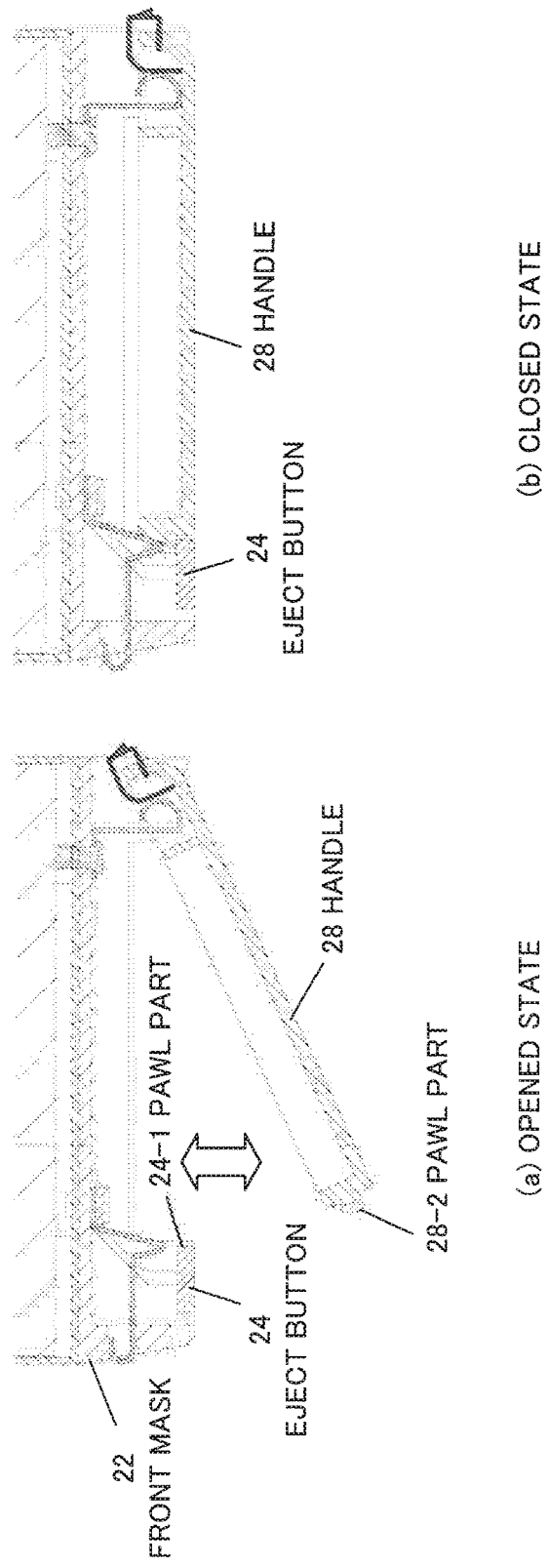
FIG. 7 illustrates an opened state and a closed state of the handle 28 in detail.

FIG. 7 illustrates the opened state and the closed state of the handle 28 in detail. FIG. 7 (a) is a cross sectional view illustrating a state that the handle 28 is opened, and FIG. 7 (b) is a cross sectional view illustrating a state that the handle 28 is closed.

When transiting from the state illustrated in FIG. 7(a) to the closed state by rotating the handle 28, a pawl part 24-1 provided at an upper right position of the eject button 24 and a pawl part 28-2 provided at a left end of the handle 28 are engaged together, and consequently the handle 28 is fixed in the closed state. Moreover, by elastically deforming the eject button in the left direction, the above-mentioned engagement of the pawls are released, and consequently the handle 28 can be rotated up to the opened state.

Figure 8:
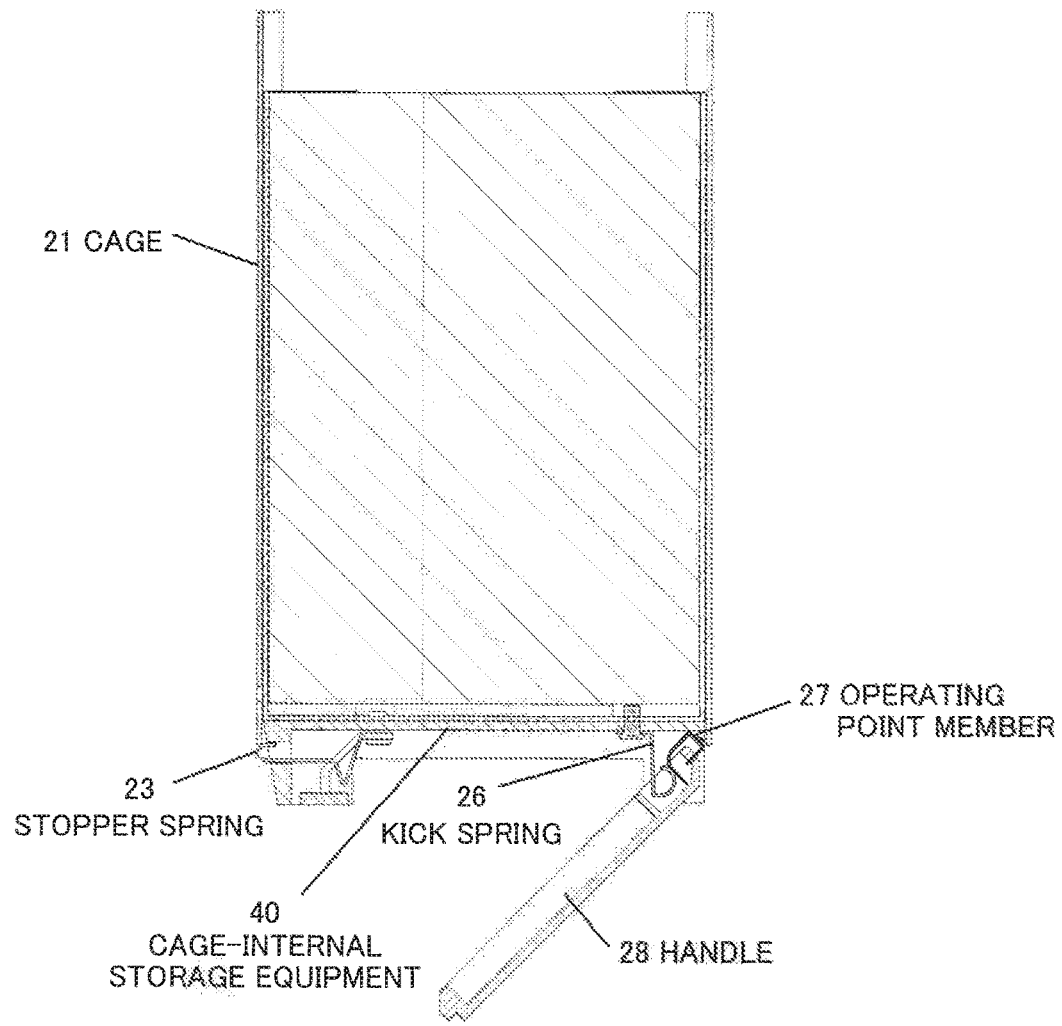
FIG. 8 is a cross sectional view illustrating a state just before a cage-internal storage device 40 is inserted halfway into a cage 21, and the stopper spring 23 enters into the cage 21.

FIG. 8 is a cross sectional view illustrating a state just before the cage-internal storage device 40 is inserted halfway into the cage 21, and the stopper spring 23 enters into the cage 21. The handle 28 is opened by 45 degrees, and the pawl 27-1 of the operating point member 27 is maximumly pushed out in an external direction by the kick spring 26.

From this state, the cage-internal storage equipment 40 is manually pushed into the cage 21. Then, the arc part 23-1 of the stopper spring 23 is pressed against the left side surface of cage 21-2, and the pawl 27-1 of the operating point member 27 is pressed against the right side surface of cage 21-1. Furthermore, a side surface of the cage-internal storage equipment 40 slides in a inner direction (upper direction in FIG. 8) of the cage 21.

Figure 9:
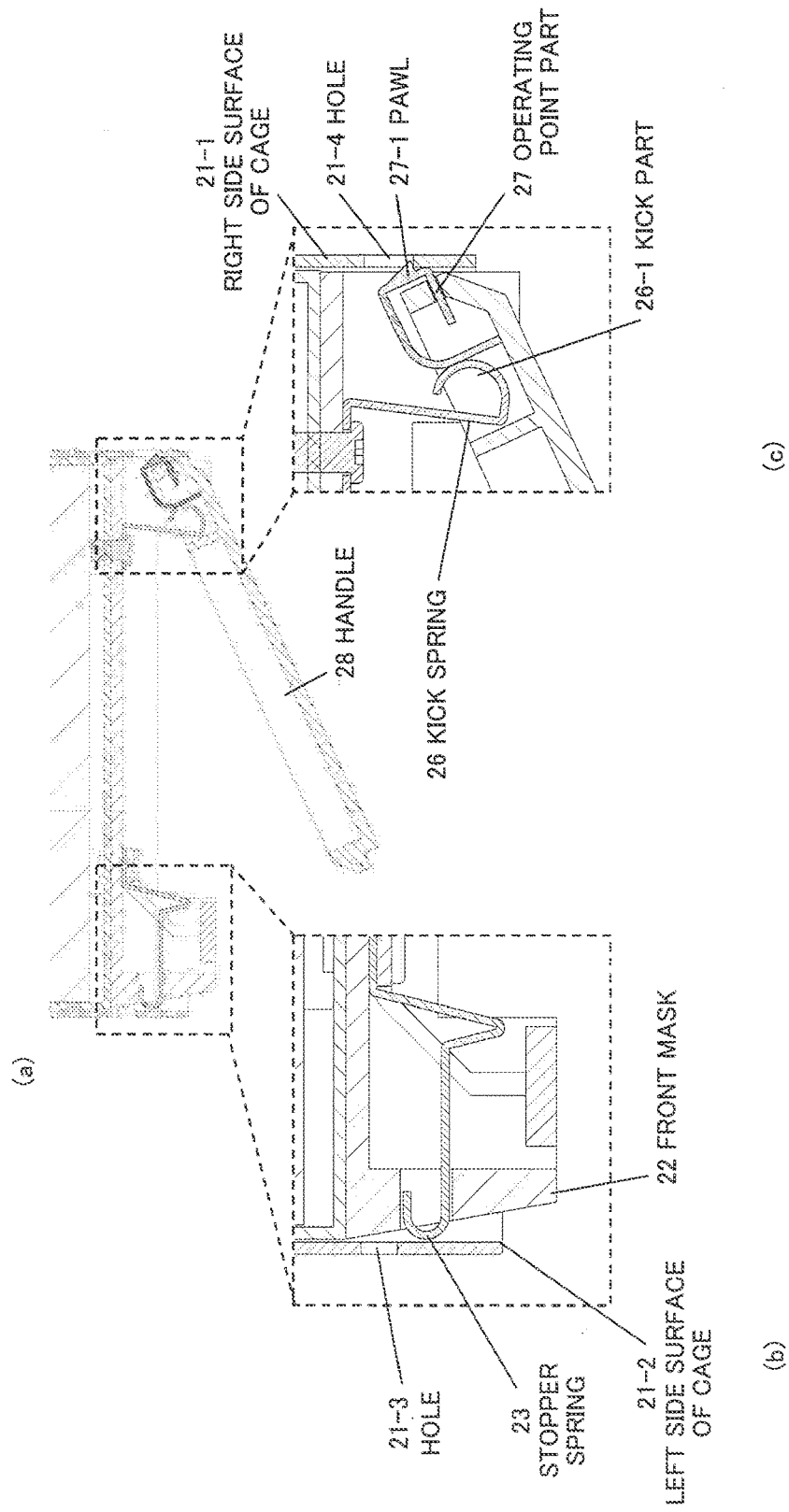
FIG. 9 illustrates a state that the cage-internal storage device 40 is pushed into the cage 21, and the handle 28 is rotated halfway in a direction toward a closed position.

FIG. 9 illustrates a state that the cage-internal storage device 40 is further pushed into the cage 21 from the above-mentioned state, and the handle 28 is rotated halfway in a closing direction. By rotating the handle 28 in the closing direction from the above-mentioned state, the operating point member 27 which is provided inside the handle 28 is pressed against the right side surface of cage 21-1 to slide in an internal (left) direction of the cage 21, and consequently the kick spring 26 is compressed.

In this state, as illustrated in FIG. 9(c), the pawl 27-1 of the operating point member 27 enters into the hole 21-4 of the right side surface of cage 21-1, and is engaged with the hole 21-4. On the other hand, as illustrated in FIG. 9 (b), the stopper spring 23, which is fixed in a state of protruding to the left from the front mask 22, is pressed against the left side surface of cage 21-2 to be kept elastically deformed in a direction toward the inside (right) of the cage. That is, the arc part 23-1 of the stopper spring 23 has not yet enter into the hole 21-3 of the left side surface of cage 21-2.

The reason is that the hole 21-4 of the right side surface of cage 21-1 is closer to the front side opening part of the cage 21, that is, the insertion opening, than the hole 21-3 of the left side surface of cage 21-2. Moreover, the reason is that the handle 28 is in the opened state, and the right side end of the handle 28 enters into the cage 21 more deeply than the stopper spring 23.

The hole 21-4 may be provided at a farther position from the front side opening part of the cage 21 than the hole 21-3 is provided. In this case, by adjusting a length of the rear surface part 23-2 of the stopper spring 23, the arc part 23-1 protrudes to the front side from the handle 28.

In the process of inserting the cage-internal storage equipment 40, another method may be applied so that the pawl 27-1 enters into the hole 21-4 and afterward the arc part 23-1 enters into the hole 21-3.

When applying force so as to rotate the handle 28 in the closing direction, the pawl 27-1 of the operating point member 27 hooked in the hole 21-4 becomes an operating point, the cage-internal storage equipment 40 is further pressed into the cage 21, and consequently the handle 28 is fixed.

Figure 10:
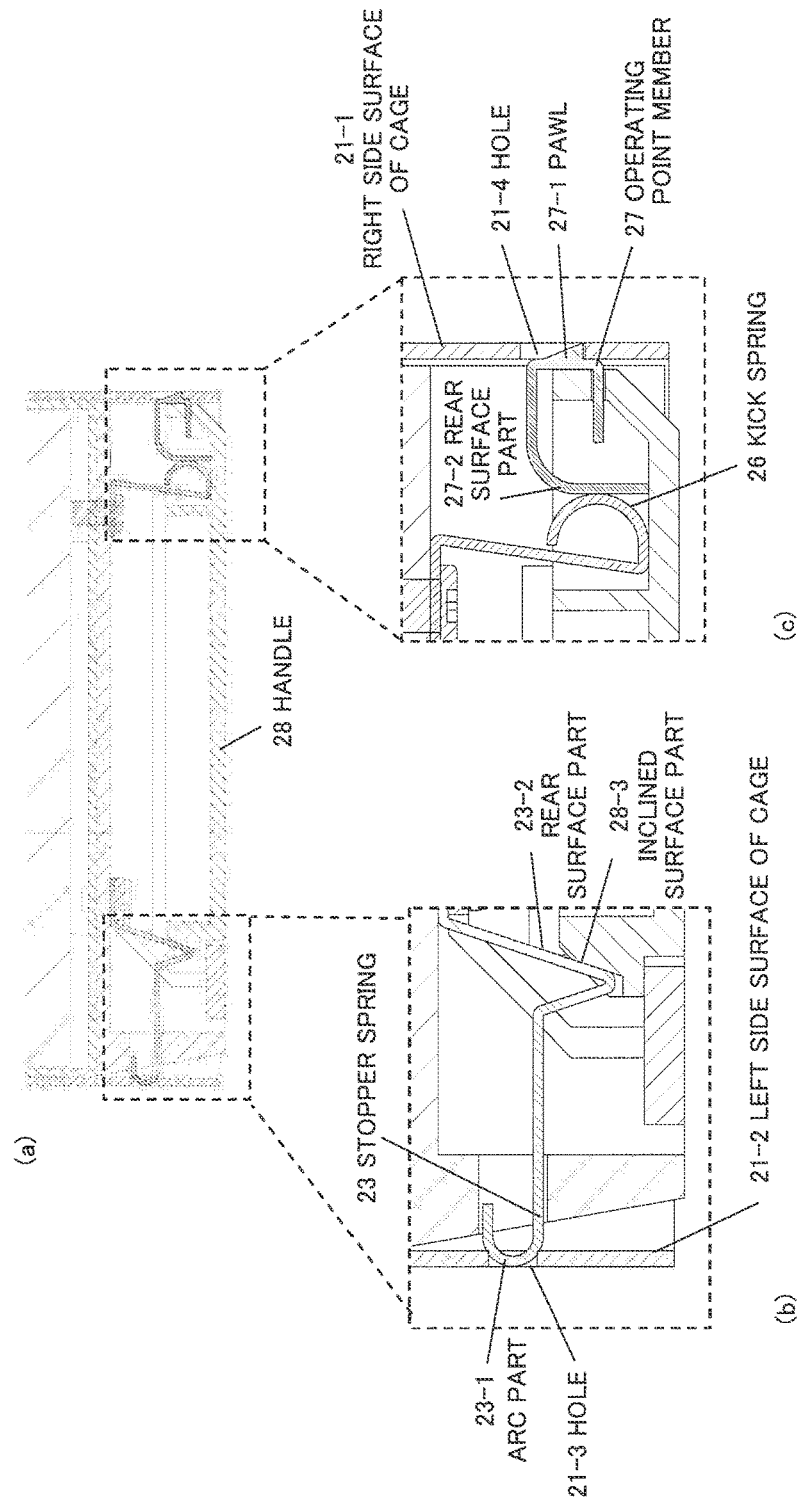
FIG. 10 illustrates a state that the handle 28 is fixed at the closed position.

FIG. 10 illustrates a state that the handle 28 is fixed in the closed state. By closing the handle 28, the operating point member 27 enters into a state of being pushed into the cage 21 deeper. The operating point member 27 is pushed out in an external (right) direction of the cage 21 by a pressure which the kick spring 26 generates. As illustrated in FIG. 10(c), the pawl 27-1 of the operating point member 27 is fit in the hole 21-4 so as to stay within a board thickness of the right side surface of cage 21-1 and consequently the pawl 27-1 does not protrude from the right side surface of cage 21-1. The reason is that a height of the pawl 27-1 is equal to or less that the thickness of the right side surface of cage 21-1.

Meanwhile, the arc part 23-1 is fitted into the hole 21-3 which is provided in the left side surface of cage 21-2, and the stopper spring 23 enters, for example, into a state of coming into contact with the hole 21-3, or a state of pushing the left side surface of cage 21-2. Furthermore, the rear surface part 23-2 of the stopper spring 23 and an inclined surface part 28-3, which acts as a non-limiting embodiment of a securing part and is provided at a left end of the handle 28, are fixed together in a contact state to prevent the stopper spring 23 from being elastically deformed in an internal (right) direction of the cage 21. The arc part 23-1 of the stopper spring 23 is fit in the hole 21-3 so as to stay within a board thickness of the left side surface of cage 21-2, and consequently the arc part 23-1 does not protrude from the left side surface of cage 21-2. The reason is that, by adjusting a radius of the arc part 23-1 and a radius of the hole 21-3, a height of the part of the arc part 23-1 which enters into the hole 21-3, out of a height of the arc part 23-1, is equal to or less than a thickness of the left side surface of cage 21-2.

The equipment securing device 30 of the present exemplary embodiment is capable of reducing the implementation area of the cage 21, and contributes to the high-density implementation of a device which uses the cage-internal storage equipment 40. The reason is that the pawl 27-1 of the operating point member 27 is movable, and enters into the hole 21-4 of the right side surface of cage 21-1 so as to stay within the board thickness of the cage. Furthermore, the reason is that the arc part 2-1 of the stopper spring 23 is movable and enters into the hole 21-4 of the left side surface of cage 21-2 so as to stay within the board thickness of the cage.

Specific advantageous effects are as follows.

In the case of the HDD carrier illustrated in FIG. 1, since an amount of protrusion of the operating point part from the side surface of the cage 11 is large, it is impossible to implement 12 HDD carriers in an HDD implementation area (438.4 mm) of the 1U (1 Unit) rack-mount server device. The reason is that, an implementation width of the HDD carrier 13 is 74.7 mm, which is a sum of 70.1 mm of the width of HDD, 0.8 mm×2 of the width of the carrier sheet metal, and 3 mm of the width of protrusion of the operating point part. Therefore, in the case that HDD carriers 13 are arranged in a two-stacked and six horizontally parallel form, a width of an area required for implementing the 12 HDD carriers 13 is 74.7 mm×6, that is, 448.2 mm.

According to the equipment securing device 30 of the present exemplary embodiment, it is possible to reduce a protrusion amount of the operating point part up to the board thickness of the side surface of the cage. An implementation width of the cage-internal storage equipment 40, which is the HDD carrier, is 72.5 mm, which is a sum of a width of HDD of 70.1 mm, a width of carrier sheet metal of 0.8×2, and an amount of the protrusion of the operating point part (that is, board thickness of the side surface of cage of 0.8 mm). A width required for arranging the cage-internal storage equipment 40 in the two-stacked and six horizontally parallel form is 72.5 mm×6, that is, 435 mm. Therefore, it is possible to store the 12 HDD carriers in the HDD implementation area of a 1U rack-mount server device 50 whose width is 438.4 mm. FIG. 12 illustrates a structure of the 1U rack-mount server device 50 equipped with 12 machines of the cage-internal storage device 40 of the present exemplary embodiment. The 1U rack-mount server device 50 includes a server main body device 51, and the cage-internal storage device equipments 40 each of which is the HDD carrier and which are arranged in the two-stacked and six horizontally parallel form.

Furthermore, the equipment securing device 30 of the present exemplary embodiment prevents ejection caused by an external factor such as an impact on the device, and contributes to improvement in reliability and product quality of the device. The reason is that the pawl 27-1 of the operating point member 27 enters into the hole 21-4 of the right side surface of cage 21-1, and the arc part 23-1 of the stopper spring 23 enters into the hole 21-4 of the left side surface of cage 21-2, and consequently the cage-internal storage equipment 40 is fixed to the cage 21. Furthermore, the reason is that the rear surface part 23-2 of the stopper spring 23 and the inclined surface part 28-3 provided at the left side of the handle 28 are fixed together in the contact state, and consequently it is prevented that the stopper spring 28 is elastically deformed in an internal (right) direction of the cage 21.

Modification of the First Exemplary Embodiment

The equipment securing device 30 may be implemented by reversing the left and right.

It is not always necessary that whole part of the pawl 27-1 of the operating point member 27 is stored within the board thickness of the hole 21-4 of the right side surface of cage 21-1. Moreover, it is not always necessary that whole part of the arc part 23-1 of the stopper spring 23 is stored within the board thickness of the hole 21-3 of the left side surface of cage 21-2. Even if there is a part protruding slightly, it is possible to reduce the implementation area for the cage 21.

Figure 11:
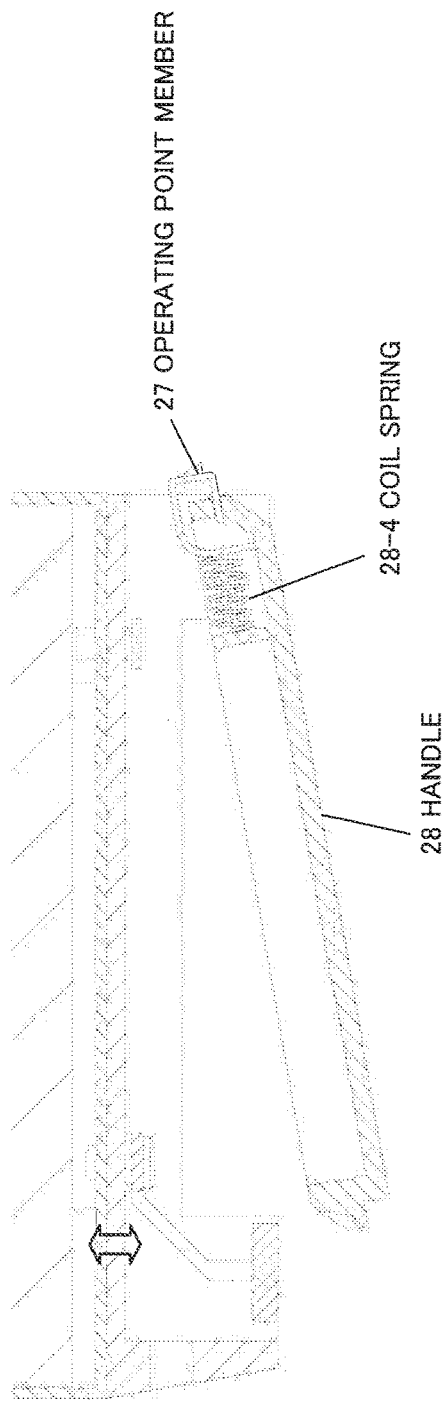
FIG. 11 illustrates a modification of the equipment securing device 30 according to the first exemplary embodiment.

FIG. 11 illustrates another modification of the first exemplary embodiment. The equipment securing device 30 according to the modification includes a coil spring 28-4, which is provided inside the handle 28, in place of the kick spring 26. The coil spring 28-4 pushes out the operating point member 27 toward the outside. Moreover, in the case that a leaf spring is used in place of the coil spring 28-4, the same advantageous effects are obtained.

Second Exemplary Embodiment

Figure 13:
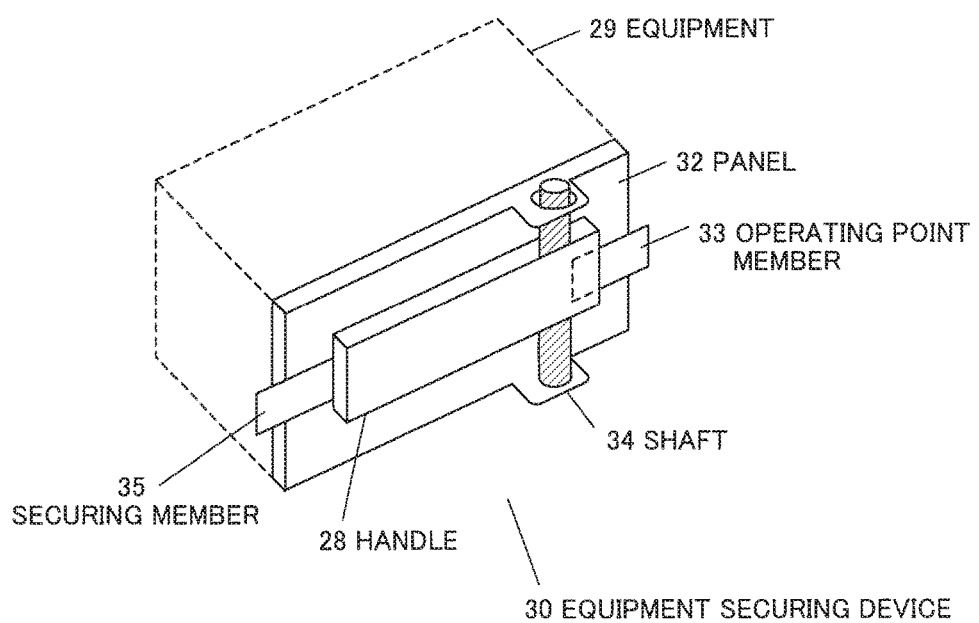
FIG. 13 is a diagram illustrating structure of the equipment securing device 30 according to a second exemplary embodiment of the present invention.

FIG. 13 is a diagram illustrating a structure of the equipment securing device 30 according to a second exemplary embodiment of the present invention. The equipment securing device 30 includes a panel 32 which is mounted on the front surface of the equipment 29, a securing member 35 and the handle 28 both of which are attached to the panel 32, and an operating point member 33 which is attached to the handle 28. Here, the equipment 29 is inserted backward into an attachment frame (not illustrated in the drawing) which has holes in the vicinity of the front part of the each side surface from a front side opening part.

In the case that one out of a left end and a right end is denoted as a first end and the other is denoted as a second end, the securing member 35 is provided in the vicinity of the first end (first end part) of the panel 32. On the way to inserting the equipment 29, a tip end of the securing member 35 is pressed against a front part of a hole of a first end side side-surface of the attachment frame by elastic force. Note that FIG. 13 is a diagram illustrating a case that the first end is the left end, and the second end is the right end.

The handle 28 includes a shaft 34 in the vicinity of the second end (second end part). The shaft 34 is attached in the vicinity of the second end of the panel 32. the handle 28 rotates between a closed position where the handle 28 leans against the panel 32, and an opened position where a left side of the handle 28 protrudes on the front side around the shaft 34.

The operating point member 33 is provided on the second end of the handle 28. On the way to inserting the equipment 29, a tip end of the operating point member 33 is pressed against a front part of a hole of a second end side side-surface by elastic force.

When the equipment 29 is further inserted into the attachment frame, the tip end of the operating point member 33 is inserted into the hole of the second end side side-surface by elastic force. When the handle 28 is rotated in a direction toward the opened state, the equipment 29 is further inserted by force which is given at a time of rotation and whose operating point is the operating point member 33. Then, the tip end of the securing member 35 is inserted into the hole of the first end side side-surface by elastic force.

Here, the panel 32 is, for example, the front mask 22. The securing member 35 is, for example, the stopper spring 23. The operating point member 33 is, for example, the operating point member 27. The attachment frame is, for example, the cage 21.

The equipment securing device 30 of the present exemplary embodiment is capable of reducing an implementation area for the attachment frame, and contributes to the high-density implementation of a device which uses the equipment 29. The reason is that the tip end of the operating point member 33 enters into the hole of the second end side side-surface of the attachment frame. Furthermore, the reason is that the securing member 35 enters into the hole of the first end side side-surface of the attachment frame. Since the securing member 35 and the tip end of the operating point member 33 enter into the holes of both side surfaces of the attachment frame respectively, the equipment 29 is safely fixed to the attachment frame even when entering into the hole of the side surface of the attachment frame shallowly. For example, even if the length is almost the same as the thickness of the side surface board, the length is sufficient.

While the invention according to the present application has been described with reference to the exemplary embodiment, the present invention according to the present application is not limited to the exemplary embodiments. It is possible to add various changes, which a person skilled in the art can understand, to the composition and details of the invention according to the present application within the scope of the invention according to the present application.

This application is based upon and claims the benefit of priority from Japanese Patent Application No. 2014-102597, filed on May 16, 2014, the disclosure of which is incorporated herein in its entirety by reference.

REFERENCE SIGNS LIST 11 cage
12 hole
13 HDD carrier
14 handle
14-1 shaft part
14-2 tip end part
21 cage
21-1 right side surface of cage
21-2 left side surface of cage
21-3 hole
21-4 hole
21-5 upper guide part
21-6 lower guide part
22 front mask
22-1 hole
22-2 hole
23 stopper spring
23-1 arc part
23-2 rear surface part
23-3 bent part
24 eject button
24-1 pawl part
25 screw
26 kick spring
26-1 kick part
27 operating point member
27-1 pawl
27-2 rear surface part
28 handle
28-1 shaft boss
28-2 pawl part
28-3 inclined surface part
28-4 coil spring
29 equipment
30 equipment securing device
32 panel
33 operating point member
34 shaft
35 securing member
40 cage-internal storage equipment
50 1U rack-mount server device
51 server's main body device

What is claimed is:

1. An equipment securing device, comprising:
a panel mounted on a front surface of an equipment inserted backward into an attachment frame;
a securing member provided on the panel dose to a first end part of the panel, a tip end of the securing member being movable to a position protruding in an extension direction of the panel from a position close to the first end part of the panel, the securing member having elasticity;
a handle including a shaft at a second end part existing on opposite side of a first end part of the handle and attached to the panel, the handle being rotatable around the shaft between a closed position and an opened position, the closed position being a position facing to the panel along the extension direction of the panel and an opened position being a position in a direction distant from the panel;
an operating point member provided on the second end part of the handle, the orientation of the operating point member changing in response to the rotation of the handle, and a tip end of the operating point member being movable to a position protruding in a direction intersecting a direction of the shaft from the second end part of the handle; and
a push-out member having elasticity and provided on the panel dose to a second end part of the panel, wherein the push-out member contacts with the operating point member, and when the handle is at the dosed position, the push-out member pushes out the operating point member, and
a securing part provided at a first end of the first end part of the handle, wherein the securing part is provided at a position at which the securing part comes into contact with the seeming member to move the tip end of the securing member for engaging the tip end with the attachment frame at the first end part of the panel when the handle is at the closed position.

2. The equipment securing device according to claim 1, wherein
the tip end of the operating point member is provided at a farther position from the panel than the tip end of the securing member is provided.

3. The equipment securing device according to claim 1, wherein
the securing member includes a first rear surface part which is a leaf spring and extends in a direction toward the first end from the panel so as to intersect the panel, and a first tip end which works together with a tip end of the first rear surface part through an elastic force part, and when the handle is at the closed position, the securing part of the handle contacts with the first rear surface part, and fixes the first rear surface part from the inside of the chassis.

4. The equipment securing device according to claim 1, wherein the operating point member includes a second rear surface part which is a leaf spring and extends in the direction toward the panel from a panel side surface of the handle and a second tip end part which works together with a tip end of the second rear surface part, the push-out member has a protruding part which protrudes in a direction toward the handle, and when the handle is at the closed position, the protruding part of the push-out member contacts with the second rear surface part and pushes out the second tip end part to the outside by pushing out the second rear surface part to the outside.

5. An attachment-frame-internal storage equipment, comprising:

the equipment; and the equipment securing device according to claim 1 attached to the equipment.

6. A rack-mount server device, comprising:

a plurality of attachment frames each having a first end side side-surface with a hole and a second end side side-surface with a hole, and stores the equipment;

a plurality of machines of the attachment-frame-internal storage equipment according to claim 5 each being stored by each of the plural attachment frames; and a server's main body device, wherein the equipment is a hard disc device.

7. The rack-mount server device according to claim 6, wherein in a state that the equipment is inserted into the attachment frame, the tip end of the securing member is pushed against the first end side side-surface by given elastic force, and the tip end of the operating point member is pushed against the second end side side-surface by given elastic force, and when the tip end of the operating point member is inserted into the hole of the second end side side-surface by given elastic force and the handle is rotated in the direction toward the closed state, the equipment is furthermore inserted by force which is given at a time of rotation and whose operating point is the operating member, and consequently the tip end of the securing member is inserted into the hole of the first end side side-surface by elastic force.

8. The rack-mount server device according to claim 6, wherein when the tip end of the securing member and the tip end of the operating point member are inserted into the hole of the first end side side-surface and the second end side side-surface respectively, the tip end of the securing member protrudes from the first end up to the outside of the first end side side-surface, and the tip end of the operating point member protrudes from the second end up to the outside of the second end side side-surface.

* * * * *